US011515195B2

(12) United States Patent
Kalita (10) Patent No.: US 11,515,195 B2
(45) Date of Patent: Nov. 29, 2022

(54) SEMICONDUCTOR CHAMBER COMPONENTS WITH HIGH-PERFORMANCE COATING

(71) Applicant: Applied Materials, Inc., Santa Clara, CA (US)

(72) Inventor: Laksheswar Kalita, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/080,560

(22) Filed: Oct. 26, 2020

(65) Prior Publication Data

US 2022/0130688 A1 Apr. 28, 2022

(51) Int. Cl.
*H01L 21/687* (2006.01)
*H01L 21/67* (2006.01)
(Continued)

(52) U.S. Cl.
CPC .... *H01L 21/68757* (2013.01); *H01J 37/3053* (2013.01); *H01J 37/32477* (2013.01); *H01J 37/32715* (2013.01); *H01L 21/6708* (2013.01); *H01L 21/67207* (2013.01); *H01L 21/6875* (2013.01); *C23C 16/4404* (2013.01); *H01J 37/32495* (2013.01); *H01L 21/3065* (2013.01); *H01L 21/6719* (2013.01)

(58) Field of Classification Search
CPC ........... H01L 21/6719; H01L 21/67207; H01L 21/3065; H01L 21/6708; H01L 21/68757; H01L 21/6875; H01J 37/3053; H01J 37/32477; H01J 37/32715; H01J 37/32495; C23C 16/4404
See application file for complete search history.

(56) References Cited

U.S. PATENT DOCUMENTS 6,106,630 A * 8/2000 Frankel ............... C23C 16/4581
  118/725
6,632,325 B2 * 10/2003 Lingampalli ............. C23C 4/00
  118/500
(Continued)

FOREIGN PATENT DOCUMENTS

CN      113948363 A  *  1/2022  ........ H01J 37/32449
KR    2014-0067790 A      6/2014
(Continued)

OTHER PUBLICATIONS

Machine translation of KR10-2015-0088211 (Year: 2015).*
(Continued)

*Primary Examiner* — Jeffrie R Lund
(74) *Attorney, Agent, or Firm* — Kilpatrick Townsend & Stockton LLP (57) ABSTRACT

Exemplary semiconductor processing chambers may include a chamber body. The chambers may include a showerhead. The chambers may include a substrate support. The substrate support may include a platen characterized by a first surface facing the showerhead. The substrate support may include a shaft coupled with the platen along a second surface of the platen opposite the first surface of the platen. The shaft may extend at least partially through the chamber body. A coating may extend conformally about the first surface of the platen, the second surface of the platen, and about the shaft.

20 Claims, 5 Drawing Sheets

(51) Int. Cl.
*H01J 7/32* (2006.01)
*H01J 37/305* (2006.01)
*H01J 37/32* (2006.01)
H01L 21/3065 (2006.01)
C23C 16/44 (2006.01)

(56) References Cited

U.S. PATENT DOCUMENTS

| | | | | |
|---|---|---|---|---|
| 6,652,713 | B2* | 11/2003 | Brown | H01L 21/67069 |
| | | | | 156/345.51 |
| 7,204,913 | B1 | 4/2007 | Singh et al. | |
| 10,266,943 | B2* | 4/2019 | Khaja | H01L 21/68792 |
| 11,299,805 | B2* | 4/2022 | Khaja | F16C 3/28 |
| 2003/0091753 | A1* | 5/2003 | Han | C23C 16/4405 |
| | | | | 427/569 |
| 2004/0173161 | A1* | 9/2004 | Mariner | H01L 21/67103 |
| | | | | 118/728 |
| 2013/0014896 | A1 | 1/2013 | Shoji et al. | |
| 2015/0376780 | A1* | 12/2015 | Khaja | H01L 21/68792 |
| | | | | 134/1.1 |
| 2016/0258064 | A1* | 9/2016 | Pareek | C23C 16/4581 |
| 2017/0204514 | A1* | 7/2017 | Kim | C23C 16/4405 |
| 2019/0080951 | A1* | 3/2019 | Huston | H01L 21/68757 |
| 2019/0203350 | A1* | 7/2019 | Khaja | F16C 3/28 |
| 2020/0024735 | A1* | 1/2020 | Wu | C23C 16/45527 |
| 2020/0090912 | A1* | 3/2020 | Park | H01L 21/67248 |
| 2020/0109484 | A1 | 4/2020 | Yanagisawa | |
| 2020/0185203 | A1* | 6/2020 | Lubomirsky | H01J 37/32697 |
| 2022/0130688 | A1* | 4/2022 | Kalita | H01L 21/67207 |

FOREIGN PATENT DOCUMENTS

| | | | |
|---|---|---|---|
| KR | 20150087974 A | * | 7/2015 |
| KR | 20150088211 A | * | 7/2015 |
| KR | 101568735 B1 | * | 11/2015 |
| KR | 20160147699 A | * | 12/2016 |
| KR | 20210002779 A | * | 1/2021 |
| KR | 20210008913 A | * | 1/2021 |
| WO | 2015-044748 A1 | | 4/2015 |

OTHER PUBLICATIONS

International Search Report and Written Opinion dated Feb. 14, 2022 in International Patent Application No. PCT/US2021/055852, 7 pages.

* cited by examiner

SEMICONDUCTOR CHAMBER COMPONENTS WITH HIGH-PERFORMANCE COATING

TECHNICAL FIELD

The present technology relates to semiconductor systems, processes, and equipment. More specifically, the present technology relates to systems including or forming coatings on chamber components.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Wet processes may also damage chamber components. For example, HF etchants may chemically attack chamber components made from metals, such as aluminum alloys. Dry etches produced in local plasmas formed within the substrate processing region can penetrate more constrained trenches and exhibit less deformation of delicate remaining structures. However, local plasmas may damage the substrate through the production of electric arcs as they discharge. Local plasmas, as well as plasma effluents, may also damage chamber components.

Thus, there is a need for improved systems and methods that can be used to produce high quality devices and structures. These and other needs are addressed by the present technology.

SUMMARY

Exemplary semiconductor processing chambers may include a chamber body. The chambers may include a showerhead. The chambers may include a substrate support. The substrate support may include a platen characterized by a first surface facing the showerhead. The substrate support may include a shaft coupled with the platen along a second surface of the platen opposite the first surface of the platen. The shaft may extend at least partially through the chamber body. A coating may extend conformally about the first surface of the platen, the second surface of the platen, and about the shaft.

In some embodiments, the coating may be or include a silicon-containing coating. The coating may be or include silicon carbide, silicon oxide, silicon nitride, silicon oxycarbide, silicon oxynitride, silicon carbon nitride, or silicon oxycarbonitride. The platen may define a plurality of protrusions extending from the first surface of the platen. The coating may extend about each protrusion of the plurality of protrusions. The coating may be characterized by a thickness on all coated surfaces of greater than or about 1 μm. The coating across the first surface of the substrate support may be characterized by a variation in thickness of less than or about 10%. A corner feature of the platen extending from the first surface may be characterized by a coating thickness that is at least 10% greater than a coating thickness along the first surface of the platen. The shaft of the substrate support may couple with a hub outside of the semiconductor processing chamber. The coating may extend along the shaft to the hub. The platen may be or include aluminum nitride. The showerhead may include a first plate and a second plate coupled together to define a volume between the first plate and the second plate. Exterior surfaces of the first plate and the second plate of the showerhead may be coated with a similar material as the substrate support.

Some embodiments of the present technology may encompass semiconductor processing methods. The methods may include delivering plasma effluents of a halogen-containing precursor into a processing region of a semiconductor processing chamber. The semiconductor processing chamber may include a chamber body. The chamber may include a showerhead. The chamber may include a substrate support. The substrate support may include a platen characterized by a first surface facing the showerhead. The substrate support may include a shaft coupled with the platen along a second surface of the platen opposite the first surface of the platen. The shaft may extend at least partially through the chamber body. A coating may extend about the first surface of the platen, the second surface of the platen, and about the shaft.

In some embodiments, the methods may include coating the substrate support in a coating chamber separate from the semiconductor processing chamber. The methods may include installing the substrate support within the semiconductor processing chamber. The methods may include processing at least 10 substrates within the semiconductor processing chamber or cleaning the processing region of the semiconductor processing chamber at least 10 times with a halogen-containing precursor prior to removing the substrate support. The coating may be or include silicon carbide, silicon oxide, silicon nitride, silicon oxycarbide, silicon oxynitride, silicon carbon nitride, or silicon oxycarbonitride. The coating may be characterized by a thickness on all coated surfaces of greater than or about 1 μm. The coating across the first surface of the substrate support may be characterized by a variation in thickness of less than or about 10%. A corner feature of the platen extending from the first surface may be characterized by a coating thickness that is at least 10% greater than a coating thickness along the first surface of the platen.

Some embodiments of the present technology may encompass semiconductor processing chambers. The chambers may include a chamber body. The chambers may include a showerhead. The chambers may include a substrate support. The substrate support may include a platen characterized by a first surface facing the showerhead. The substrate support may include a shaft coupled with the platen along a second surface of the platen opposite the first surface of the platen. The shaft may extend at least partially through the chamber body. A coating may extend about the first surface of the platen, the second surface of the platen, and about the shaft. The coating may be characterized by a thickness on all coated surfaces of greater than or about 5 μm. In some embodiments, the coating may be or include silicon carbide, silicon oxide, silicon nitride, silicon oxycarbide, silicon oxynitride, silicon carbon nitride, or silicon oxycarbonitride.

Such technology may provide numerous benefits over conventional systems and techniques. For example, embodiments of the present technology may provide substrate supports that may be protected from any number of corrosive processes. Additionally, the protective coatings formed on the substrate supports and/or other components may be maintained for hundreds or thousands of wafers, which may increase throughput. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Semiconductor processing may include a number of operations that produce intricately patterned material on a substrate. The operations may include a number of formation and removal processes, which may utilize corrosive or erosive materials, including plasma-enhanced materials formed either remotely or at the substrate level. For example, a halogen-containing gas may be flowed into a processing region where the gas or plasma effluents of the material contacts a substrate positioned within the region. While the etchant may preferentially etch the substrate material, the chemical etchant may also contact other components within the chamber. The etchant may chemically attack the components, and depending on the process performed, one or more of the components may be bombarded with plasma effluents, which may also erode materials. The chemical and physical damage to the chamber components caused by the etchant may cause wear over time, which may increase replacement costs and down time for the chamber. Deposition processes similarly may use plasma enhanced processes to form or deposit materials on substrates, which may also be deposited on chamber components. This may require cleaning operations once a substrate has been removed from the chamber. Cleaning processes may include utilizing one or more halogen-containing precursors or plasma effluents of these precursors to remove material deposited on surfaces in the processing chamber. While the cleaning may target deposited material, many exposed chamber component surfaces may be similarly attacked. For example, once the substrate has been removed from the processing chamber, a central region of the substrate support will be exposed with no residual material. The cleaning process may begin to form pitting or other removal of the substrate support, which may reduce planarity, as well as integrity for a chuck.

Conventional technologies have struggled to limit both corrosion and erosion to chamber components, and tend to replace components regularly due to the damage caused by one or both of these mechanisms. Although some processes may include a seasoning process prior to the semiconductor substrate processing, this may cause additional challenges. For example, seasoning processes may cover portions of the substrate support, but may not fully cover a backside or stem, which may still be exposed to process and cleaning materials. Additionally, seasoning processes typically deposit a hundred nanometers of coating or less. This may require the seasoning to be replaced for each substrate being processed, which may increase queue times, and may also reduce the likelihood of a uniform or complete coverage. The present technology overcomes these issues by coating chamber components prior to substrate processing. For example, components may be completely coated on surfaces exposed within a semiconductor processing chamber. Additionally, the coatings may be characterized by increased thicknesses, which may improve both complete coverage, as well as allowing the component to be used in processing a number of wafers before the coating is reapplied.

Although the remaining disclosure will routinely identify specific etch processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific etching processes or chambers alone. The disclosure will discuss one possible system and chamber that may include pedestals according to embodiments of the present technology before additional variations and adjustments to this system according to embodiments of the present technology are described.

Figure 1:
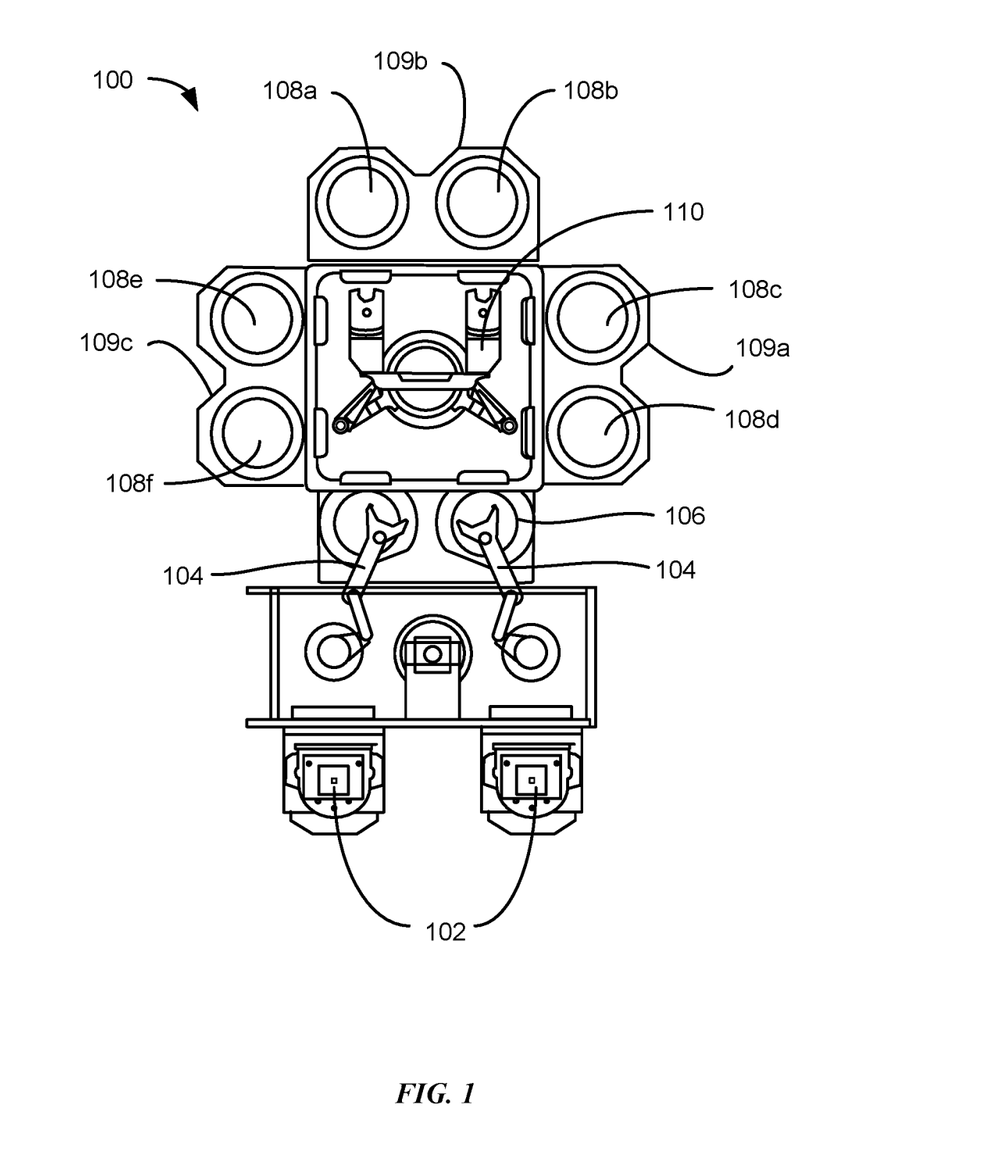
FIG. 1 shows a top plan view of an exemplary processing system according to some embodiments of the present technology.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2A:
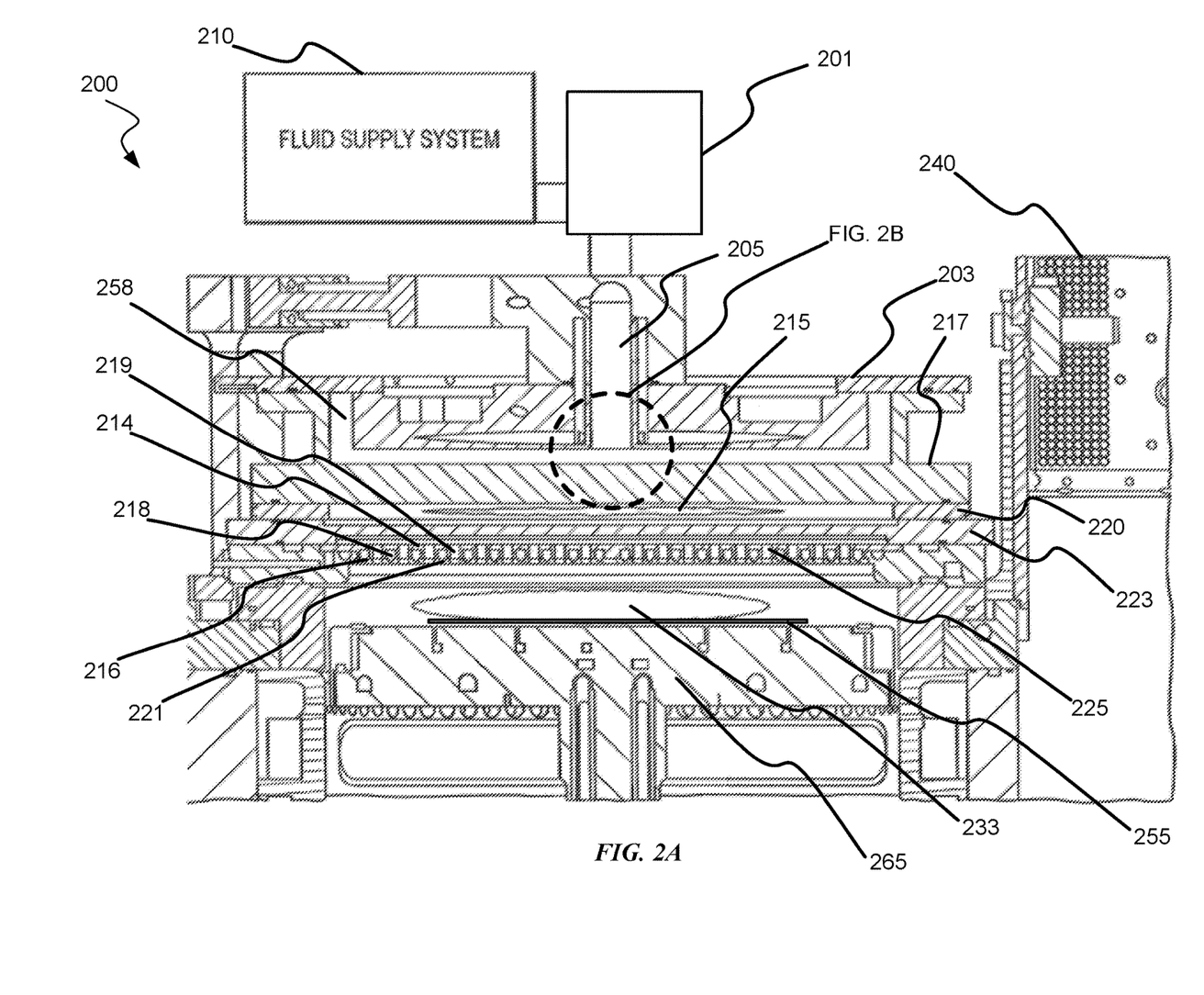
FIG. 2A shows a schematic cross-sectional view of an exemplary processing chamber according to embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a pedestal 265 or substrate support, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may include aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
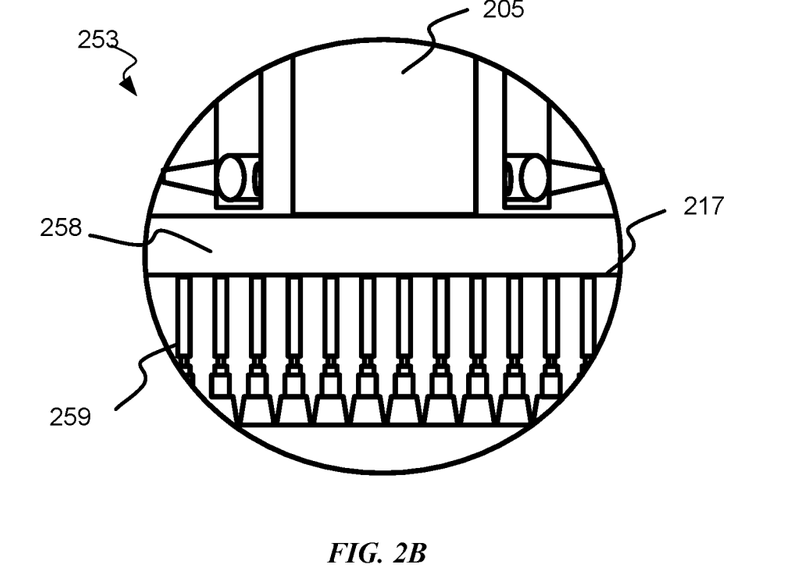
FIG. 2B shows a detailed view of a portion of the processing chamber illustrated in FIG. 2A according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
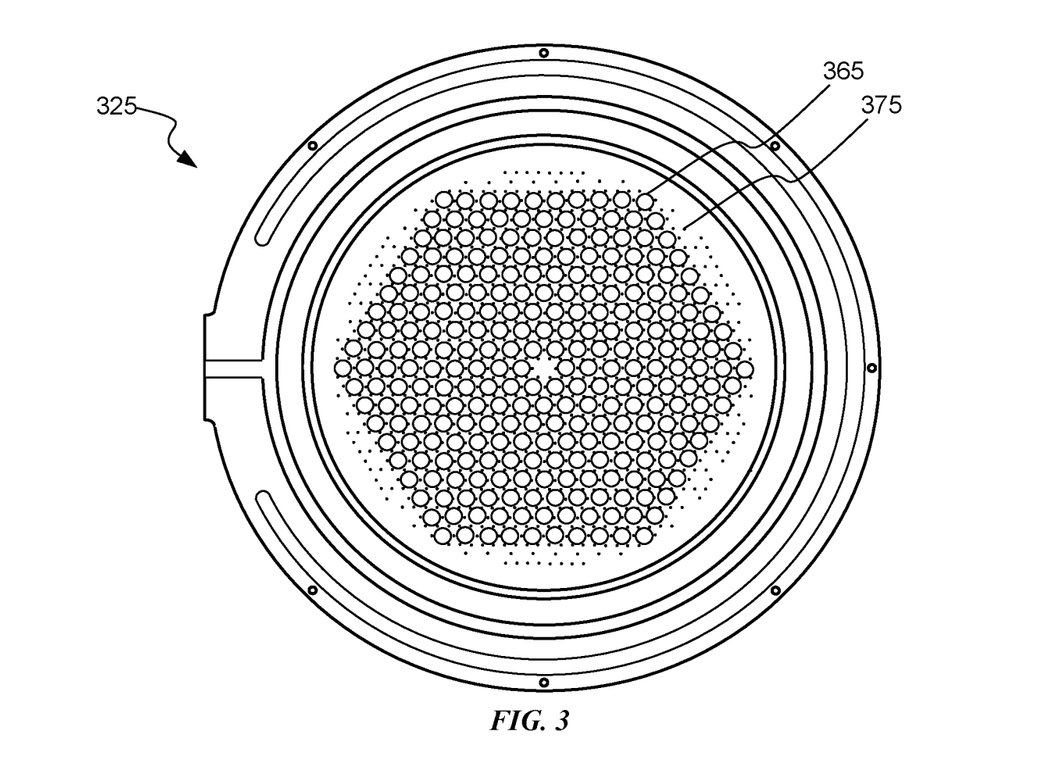
FIG. 3 shows a bottom plan view of an exemplary showerhead according to embodiments of the present technology.

The gas distribution assemblies such as showerhead 225 for use in the processing chamber section 200 may be referred to as dual channel showerheads and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the showerhead 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
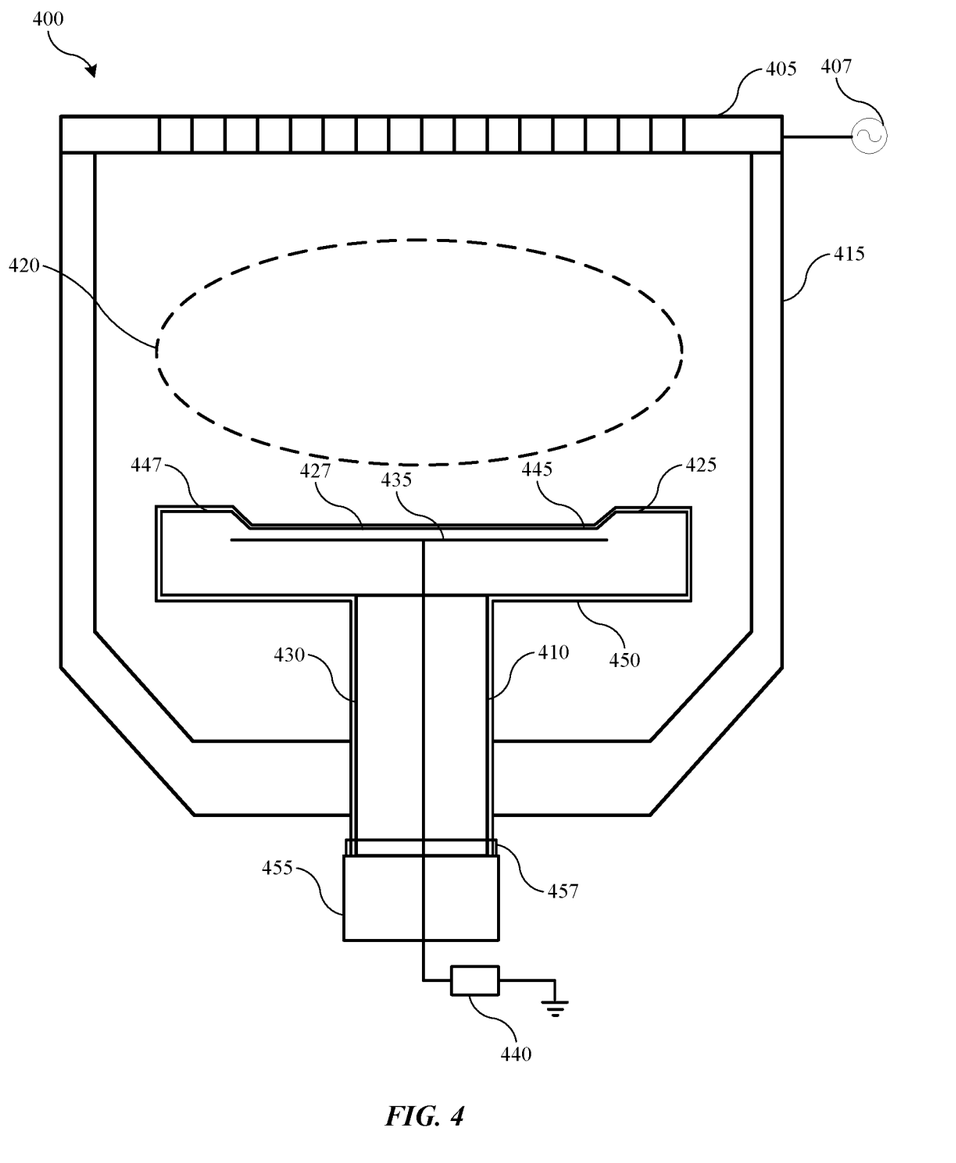
FIG. 4 shows a schematic partial cross-sectional view of an exemplary semiconductor processing chamber according to some embodiments of the present technology.

FIG. 4 shows a schematic partial cross-sectional view of an exemplary semiconductor processing chamber 400 according to some embodiments of the present technology. FIG. 4 may include one or more components discussed above with regard to FIG. 2A, and may illustrate further details relating to that chamber. The chamber 400 may be used to perform semiconductor processing operations including etching or removal as well as deposition or cleaning operations. For example, processing chamber 400 may be a chamber for a plasma etcher or plasma etch reactor, a plasma cleaner, a chemical vapor deposition chamber, a physical vapor deposition chamber, an atomic layer deposition chamber, or any other type of semiconductor processing chamber. Chamber 400 may show a partial view of a processing region of a semiconductor processing system, and may not include all of the components, such as additional lid stack components previously described, which are understood to be incorporated in some embodiments of chamber 400.

As noted, FIG. 4 may illustrate a portion of a processing chamber 400. The chamber 400 may include a showerhead 405, as well as a substrate support 410. Along with chamber sidewalls 415, the showerhead 405 and the substrate support 410 may define a substrate processing region 420 in which plasma may be generated in some processes. Processing region 420 may also illustrate where a substrate may be housed for semiconductor processing. The substrate support assembly may include a platen 425, which may include one or more components embedded or disposed within the body, including electrodes, heaters, fluid channels, or other components. The components incorporated within the top puck may not be exposed to processing materials in some embodiments, and may be fully retained within the platen 425. Platen 425 may define a substrate support surface 427 that may face the showerhead 405, and may be characterized by a thickness and length or diameter depending on the specific geometry of the platen. In some embodiments the platen may be elliptical, and may be characterized by one or more radial dimensions from a central axis through the body. It is to be understood that the top puck may be any geometry, and when radial dimensions are discussed, they may define any length from a central position of the platen.

Platen 425 may be coupled with a stem or shaft 430, which may support the platen and may include channels for delivering and receiving electrical and/or fluid lines that may couple with internal components of the platen 425. Platen 425 may include associated channels or components to operate as an electrostatic chuck, a vacuum chuck, or any other type of chucking system, as well as a non-chucking substrate support surface. Shaft 430 may be coupled with the platen on a second surface of the platen opposite the substrate support surface. The platen 425 may include an electrode 435, which may be a DC electrode, embedded within the platen proximate the substrate support surface. Electrode 435 may be electrically coupled with a power source 440. Power source 440 may be configured to provide energy or voltage to the electrically conductive chuck electrode 435. This may be operated to form a plasma of a precursor within the processing region 420 of the semiconductor processing chamber 400, although other plasma operations may similarly be sustained. For example, electrode 435 may also be a chucking mesh that operates as electrical ground for a capacitive plasma system including an RF source 407 electrically coupled with showerhead 405. For example, electrode 435 may operate as a ground path for RF power from the RF source 407, while also operating as an electric bias to the substrate to provide electrostatic clamping of the substrate to the substrate support surface. Power source 440 may include a filter, a power supply, and a number of other electrical components configured to provide a chucking voltage. Electrode 435 may also or alternatively be a heating element that can be incorporated within the platen in addition to or alternatively to an electrode.

In some embodiments, platen 425 may also define a recessed region 445 within the substrate support surface, which may provide a recessed pocket in which a substrate may be disposed. Recessed region 445 may be formed at an interior region of the top puck and may be configured to receive a substrate for processing. Recessed region 445 may encompass a central region of the platen as illustrated, and may be sized to accommodate any variety of substrate sizes. A substrate may be seated within the recessed region, and contained by an exterior region 447, which may encompass the substrate. In some embodiments the height of exterior region 447 may be such that a substrate is level with or recessed below a surface height of the substrate support surface at exterior region 447. A recessed surface may control edge effects during processing, which may improve uniformity across the substrate in some embodiments. In some embodiments, an edge ring may be disposed about a periphery of the top puck, and may at least partially define the recess within which a substrate may be seated. In some embodiments, the surface of the platen may be substantially planar, and the edge ring may fully define the recess within which the substrate may be seated. Additionally, the platen may be characterized by an edge profile as discussed further below, or any other geometry or features that may be produced about the substrate support.

In some embodiments the platen 425 and/or the shaft 430 may be insulative or dielectric materials, although in some embodiments they may be metals, such as aluminum or other conductive materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties. Exemplary dopant materials may include yttrium, magnesium, silicon, iron, calcium, chromium, sodium, nickel, copper, zinc, or any number of other elements known to be incorporated within a ceramic or dielectric material.

The heater may be capable of adjusting temperatures across the platen 425, as well as a substrate residing on the substrate support surface 427. The heater may have a range of operating temperatures to heat the platen and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges.

As described previously, the present technology may perform processing in chambers incorporating coated chamber components. Although the remaining disclosure will regularly discuss substrate supports, in some embodiments any component may be similarly coated with any of the coating materials described below, including chamber walls or any lid stack component. For example, a showerhead, which may include two plates coupled together may be coated as each plate individually prior to coupling, or once coupled the showerhead may be coated as described below on some or all exterior surfaces of the showerhead.

Substrate support 410 may include a coating 450 that may extend about all exposed surfaces of the substrate support 410 including the first surface and second surface of the platen, as well as the shaft. The coating may be formed conformally about each component separately or together. For example, the coating 450 may be applied subsequent coupling of the platen and the stem, or applied to each component prior to connection. Shaft 430 may at least partially extend through the chamber body as illustrated, and in some embodiments the entire length of the shaft may be coated, including through the chamber. Shaft 430 may be coupled with a hub 455, which may be positioned outside of the processing chamber as illustrated. The coating 450 may extend along the shaft body to the hub. A ring connector 457 may extend about the shaft and connect the shaft with the hub, and the coating may extend within a portion of the connector in some embodiments.

Figure 5:
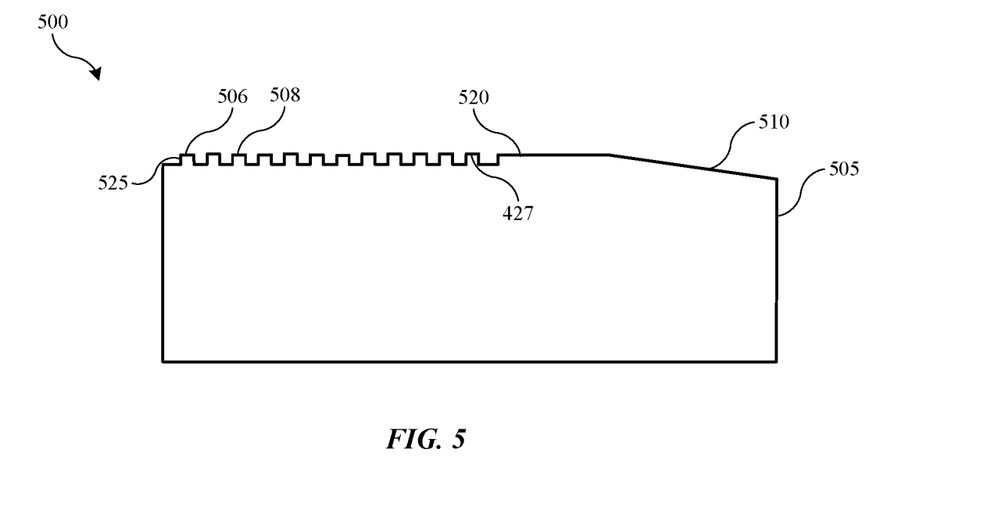
FIG. 5 shows a schematic partial cross-sectional view of an exemplary substrate support assembly according to some embodiments of the present technology.

FIG. 5 shows a schematic partial cross-sectional view of an exemplary substrate support assembly 500 according to some embodiments of the present technology, and may show additional details of the coated platen 425 as illustrated previously. Although the coating is not shown, it is to be understood that the coating may conformally extend about all surfaces as described above, including the protrusions and the edge features described here. Substrate support assembly 500 may include any of the materials or components previously described, and may illustrate additional details of substrate support assemblies previously discussed. As illustrated, a platen 505 may define a substrate support surface 506. In some embodiments, although the surface may be flat, in some embodiments features may be included and may be defined by the platen. These features may be configured to support a semiconductor substrate. The substrate support surface may define an area 508 within the substrate support surface where a substrate may be maintained, such as a recessed pocket as discussed above. Although a recessed pocket may be formed with an exterior section, in some embodiments any number of other edge features may be formed extending from the first surface of the substrate support. For example, a recessed ledge 510 may be defined in the substrate support surface as well. The recessed ledge may extend radially outward from an outer radial edge of the recessed pocket to an exterior edge of the platen.

Additionally, the substrate support surface may define a number of protrusions 525 extending from the substrate support surface within the support surface in area 508. An exposed surface across the protrusions 525 may define contact locations where a substrate may contact the substrate support surface. For example, the present technology may form protrusions characterized by a diameter or width of about 1 mm, about 2 mm, or more, and may in some embodiments include a combination of protrusions characterized by a diameter of greater than or about 1 mm and protrusions characterized by a diameter of greater than or about 2 mm. The protrusions may be characterized by any number of geometries and profiles in embodiments of the present technology. For an exemplary substrate support assembly, the substrate support surface within the recessed pocket may define greater than or about 250 protrusions, and may define greater than or about 500 protrusions, greater than or about 750 protrusions, greater than or about 1,000 protrusions, greater than or about 1,250 protrusions, greater than or about 1,500 protrusions, greater than or about 1,750 protrusions, greater than or about 2,000 protrusions, or more. The protrusions may be defined in any number of formations or patterns including uniform patterns as well as general distributions across the surface.

Coating 450 may be formed on all areas of the substrate support. Unlike seasoning processes, coating 450 may be formed consistently about the substrate support, including along the backside of the platen and along an entire length of the shaft. The coating may be or include a silicon-containing coating, and may be or include silicon carbide, silicon oxide, silicon nitride, silicon oxycarbide, silicon oxynitride, silicon carbon nitride, or silicon oxycarbonitride, as well as any combination of these materials. The coating may be formed to a thickness of greater than or about 1 µm across all surfaces of the pedestal, and may be formed to a thickness of greater than or about 2 µm, greater than or about 5 µm, greater than or about 10 µm, greater than or about 15 µm, greater than or about 20 µm, greater than or about 25 µm, greater than or about 30 µm, or more. This may produce a coating that may be many orders of magnitude thicker than any seasoning and also produce a coating that covers all surfaces of the component, unlike seasoning. Additionally, the coating may be maintained at a thickness less than or about 50 µm, less than or about 45 µm, less than or about 40 µm, less than or about 35 µm, or less, which may ensure that the coating may be formed about all surfaces of the protrusions in some embodiments, while not completely filling the features.

The coating may be produced by any number of methods including plasma-enhanced chemical vapor deposition, which may form a consistent coating about features. For example, in some embodiments a thickness of the coating across the substrate support surface may be maintained substantially consistent and may be characterized by a variation across the surface of less than or about 10% between any two locations on the substrate support surface, and may be characterized by a variation across the surface of less than or about 9%, less than or about 8%, less than or about 7%, less than or about 6%, less than or about 5%, less than or about 4%, less than or about 3%, less than or about 2%, less than or about 1%, or less.

Based on the coating process, some surfaces may be characterized by a greater amount of coverage. For example, recessed ledge 510, or any other corner feature, including the ledge defining the recessed interior pocket as described above, may be characterized by a coating thickness that is at least 10% greater than a coating thickness along the first surface of the platen, and may be characterized by a coating thickness that is greater than or about 15% greater than a coating thickness along the first surface of the platen, greater than or about 20%, greater than or about 30%, greater than or about 40%, greater than or about 50%, greater than or about 60%, greater than or about 70%, greater than or about 80%, greater than or about 90%, greater than or about 100%, or more. Because these features, such as corner features, may be exposed during plasma operations, unlike the substrate surface or backside surfaces, which may be covered or out of a direct flow path or plasma region, the additional coverage may increase protection of these regions during processing, which may further increase a time between re-coating may be performed on the chamber component.

Figure 6:
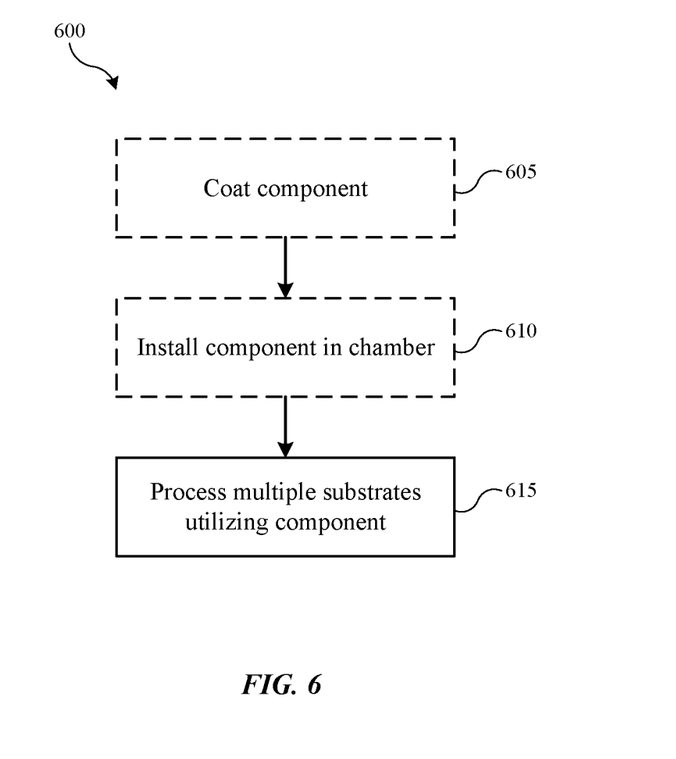
FIG. 6 shows exemplary operations in a method according to some embodiments of the present technology.

FIG. 6 shows exemplary operations in a method 600 according to some embodiments of the present technology, which may be performed in any chamber including chamber components having coatings as previously described. The coating may be applied in a coating chamber at optional operation 605, which may be separate from a semiconductor processing chamber in which substrates may be processed using the chamber components. The coating may be applied on all surfaces of the component and include any of the materials as discussed above. The coating or component may be characterized by any feature or characteristic as previously described. For example, a silicon-containing material may be coated over all surfaces of the platen and shaft of a substrate support, or exterior surfaces of a coupled substrate support, or other chamber component. The chamber component may be installed in a semiconductor processing chamber at optional operation 610, which may have the component extend partially or fully within the chamber. For example, substrate supports as previously described may at least partially extend out from the chamber, including portions that may include the coating previously applied.

At operation 615, semiconductor processing may be performed on the component. For example, any number of substrates may be processed in a chamber utilizing a coated component as discussed above, or any number of cleaning operations may be performed in a processing chamber. For example, greater than or about 5 substrates may be processed or cleaning operations may be performed. Although the coating may be impacted with each process, the coatings may allow greater than or about 10 substrates to be processed or cleaning operations to be performed, and may allow greater than or about 50, greater than or about 100, greater than or about 500, greater than or about 1,000, greater than or about 5,000, or more. By limiting downtime for seasoning or component replacement, the coated components according to embodiments of the present technology may improve throughput and protect components over conventional technologies.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an electrode" includes a plurality of such electrodes, and reference to "the protrusion" includes reference to one or more protrusions and equivalents thereof known to those skilled in the art, and so forth.

Also, the words "comprise(s)", "comprising", "contain(s) ", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing chamber comprising:
   a chamber body;
   a showerhead; and
   a substrate support comprising:
     a platen comprising a disc characterized by a first surface facing the showerhead, wherein the platen comprises an electrode embedded within the disc and extending across a center of the disc, and wherein the first surface defines a substrate support surface and comprises an exterior region that extends radially outward from an outer radial edge of the substrate support surface to peripheral edge of the first surface; and
     a shaft coupled with the platen along a second surface of the disc opposite the first surface of the disc, wherein:
       the shaft extends at least partially through the chamber body;
       a coating extends conformally about the first surface of the disc, the second surface of the disc, and about the shaft; and
       the exterior region is characterized by a coating thickness that is greater than a coating thickness along the substrate support surface.

2. The semiconductor processing chamber of claim 1, wherein the coating comprises a silicon-containing coating.

3. The semiconductor processing chamber of claim 2, wherein the coating comprises silicon carbide, silicon oxide, silicon nitride, silicon oxycarbide, silicon oxynitride, silicon carbon nitride, or silicon oxycarbonitride.

4. The semiconductor processing chamber of claim 1, wherein the platen defines a plurality of protrusions extending from the substrate support surface, and wherein the protrusions extend across a central region of the disc.

5. The semiconductor processing chamber of claim 4, wherein the coating extends about each protrusion of the plurality of protrusions.

6. The semiconductor processing chamber of claim 1, wherein the coating is characterized by a thickness on all coated surfaces of greater than or about 1 µm.

7. The semiconductor processing chamber of claim 6, wherein the coating across the first surface of the substrate support is characterized by a variation in thickness of less than or about 10%.

8. The semiconductor processing chamber of claim 6, wherein a corner feature of the platen extending from the first surface is characterized by a coating thickness that is at least 10% greater than a coating thickness along the first surface of the platen.

9. The semiconductor processing chamber of claim 1, wherein the shaft of the substrate support couples with a hub outside of the semiconductor processing chamber, and wherein the coating extends along the shaft to the hub.

10. The semiconductor processing chamber of claim 1, wherein the platen comprises aluminum nitride.

11. The semiconductor processing chamber of claim 1, wherein the showerhead comprises a first plate and a second plate coupled together to define a volume between the first plate and the second plate, and wherein exterior surfaces of the first plate and the second plate of the showerhead are coated with a similar material as the substrate support.

12. The semiconductor processing chamber of claim 1, wherein a central location on the second surface of the platen about which the shaft is coupled is free of the coating.

13. The semiconductor processing chamber of claim 1, wherein the coating thickness of the exterior region is at least 10% greater than the coating thickness along the first surface of the platen.

14. A semiconductor processing chamber comprising:
   a chamber body;
   a showerhead; and
   a two-piece substrate support comprising:
     a platen characterized by a first surface facing the showerhead, wherein the first surface defines a substrate support surface and comprises a recessed ledge that extends radially outward at a downward angle from an outer radial edge of the substrate support surface to a peripheral edge of the first surface; and
     a shaft coupled with the platen along a second surface of the platen opposite the first surface of the platen, wherein:
       the shaft extends at least partially through the chamber body;

a coating extends about the first surface of the platen, the second surface of the platen, a joint between the platen and the shaft, and about the shaft;

the coating is characterized by a thickness on all coated surfaces of greater than or about 5 μm; and the recessed ledge is characterized by a coating thickness that is greater than a coating thickness along the substrate support surface.

15. The semiconductor processing chamber of claim 14, wherein the coating comprises silicon carbide, silicon oxide, silicon nitride, silicon oxycarbide, silicon oxynitride, silicon carbon nitride, or silicon oxycarbonitride.

16. The semiconductor processing chamber of claim 14, wherein the platen comprises an electrode embedded within the platen and extending across a center of the platen.

17. The semiconductor processing chamber of claim 14, wherein the platen defines a plurality of protrusions extending from the substrate support surface, wherein the protrusions extend across a central region of the platen, wherein the coating extends about each protrusion of the plurality of protrusions and extends along sides of the platen to a backside of the platen.

18. The semiconductor processing chamber of claim 14, wherein the shaft of the substrate support couples with a hub outside of the semiconductor processing chamber, and wherein the coating extends along the shaft to the hub.

19. The semiconductor processing chamber of claim 14, wherein the platen comprises aluminum nitride.

20. The semiconductor processing chamber of claim 14, wherein the coating thickness of the recessed ledge is at least 10% greater than the coating thickness along the first surface of the platen.

* * * * *